(12) United States Patent
Kante et al.

(10) Patent No.: US 12,191,633 B2
(45) Date of Patent: Jan. 7, 2025

(54) SYSTEM AND METHOD FOR TOPOLOGICAL LASERS GENERATING AND MULTIPLEXING OPTICAL BEAMS WITH UNBOUNDED ORBITAL ANGULAR MOMENTA

(71) Applicant: THE REGENTS OF THE UNIVERSITY OF CALIFORNIA, Oakland, CA (US)

(72) Inventors: Boubacar Kante, La Jolla, CA (US); Babak Bahari, La Jolla, CA (US)

(73) Assignee: THE REGENTS OF THE UNIVERSITY OF CALIFORNIA, Oakland, CA (US)

(*) Notice: Subject to any disclaimer, the term of this patent is extended or adjusted under 35 U.S.C. 154(b) by 694 days.

(21) Appl. No.: 17/442,189

(22) PCT Filed: Mar. 25, 2020

(86) PCT No.: PCT/US2020/024652
§ 371 (c)(1),
(2) Date: Sep. 23, 2021

(87) PCT Pub. No.: WO2020/198321
PCT Pub. Date: Oct. 1, 2020

(65) Prior Publication Data
US 2022/0173574 A1 Jun. 2, 2022

Related U.S. Application Data

(60) Provisional application No. 62/823,164, filed on Mar. 25, 2019.

(51) Int. Cl.
*H01S 5/11* (2021.01)
*H01S 5/10* (2021.01)
(Continued)

(52) U.S. Cl.
CPC .............. *H01S 5/1071* (2013.01); *H01S 5/11* (2021.01); *H01S 5/12* (2013.01); *H01S 5/34373* (2013.01);
(Continued)

(58) Field of Classification Search
CPC .................................................. H01S 5/0607
See application file for complete search history.

(56) References Cited

U.S. PATENT DOCUMENTS

| 7,689,068 B1 | 3/2010 | Wang et al. |
| 9,331,875 B2 | 5/2016 | Ashrafi et al. |
| 2020/0176943 A1* | 6/2020 | Kante .................. H01S 5/1071 |

FOREIGN PATENT DOCUMENTS

WO WO-2018185749 A1 * 10/2018 ........... G02B 6/1225

OTHER PUBLICATIONS

Babak Bahari et al. ,Nonreciprocal lasing in topological cavities of arbitrary geometries.Science358,636 640(2017).DOI:10.1126/science.aao4551 (Year: 2017).*

(Continued)

*Primary Examiner* — Michael Carter
*Assistant Examiner* — Stephen Sutton Kotter
(74) *Attorney, Agent, or Firm* — Kaplan Breyer Schwarz LLP

(57) ABSTRACT

An optical integrated light source includes a plurality of topological ring resonators. Each of the topological ring resonators is defined by an interface between two distinct periodic structures having different topological invariants such that a one-way edge mode may be excited along the interface. A magnetic material is arranged to interact with the plurality of topological ring resonators such that the optical integrated light source is structured and configured to generate plural beams each carrying large orbital angular momentum.

17 Claims, 5 Drawing Sheets

(51) Int. Cl.
  *H01S 5/12*   (2021.01)
  *H01S 5/343*  (2006.01)
  *H01S 5/40*   (2006.01)
  *H04J 14/00*  (2006.01)
  *H01S 5/04*   (2006.01)
  *H01S 5/042*  (2006.01)

(52) U.S. Cl.
  CPC ............ *H01S 5/4025* (2013.01); *H04J 14/07* (2023.08); *H01S 5/041* (2013.01); *H01S 5/042* (2013.01)

(56) References Cited

OTHER PUBLICATIONS

Bahari et al. "Topological lasers generating and multiplexing topological light" arXiv prepring arXiv:1904. 11873 (2019) Apr. 26, 2019 (Provided in IDS) (Year: 2019).*

Bahari et al. "Topological lasers generating and multiplexing topological light" arXiv preprint arXiv:1904.11873 (2019) Apr. 26, 2019.

\* cited by examiner

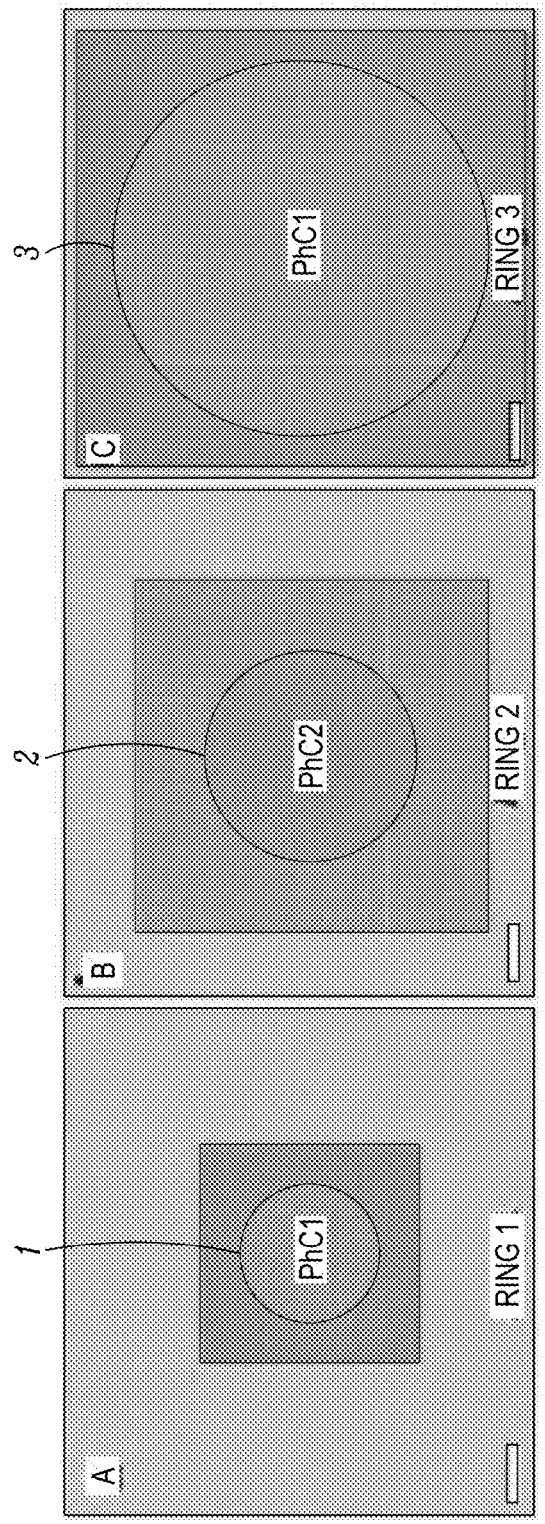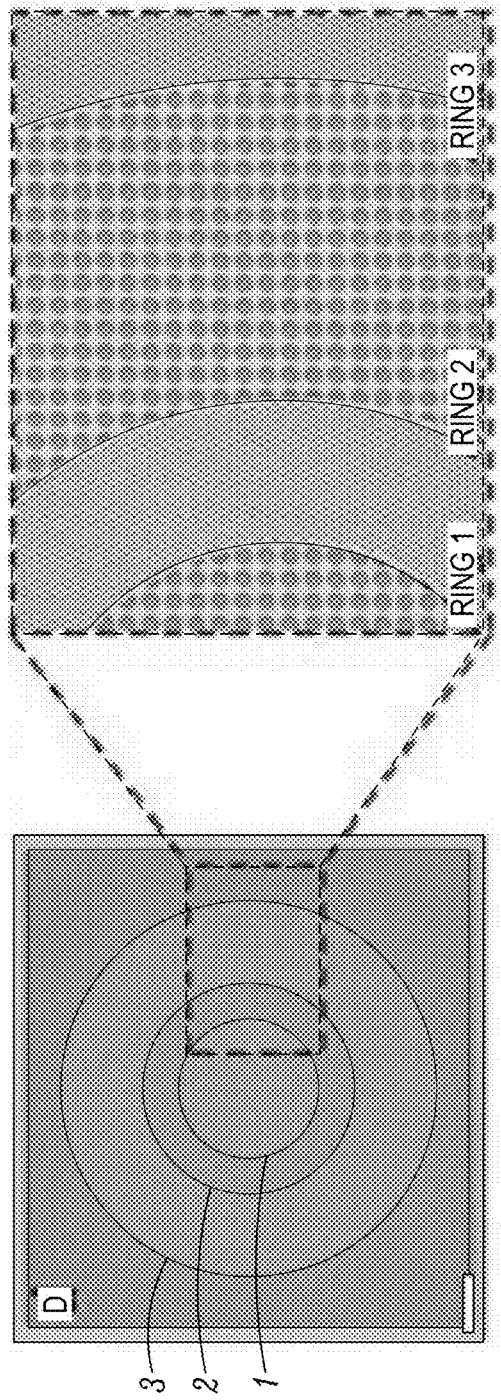

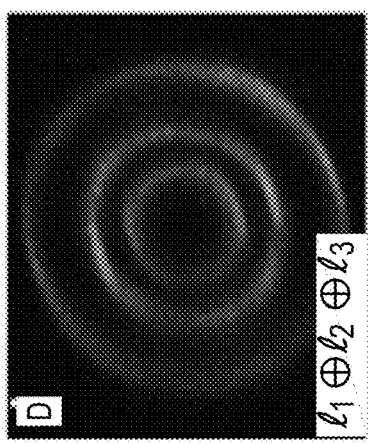
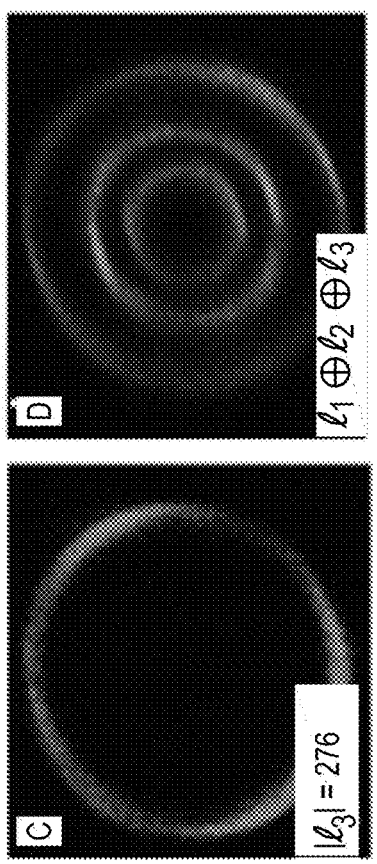
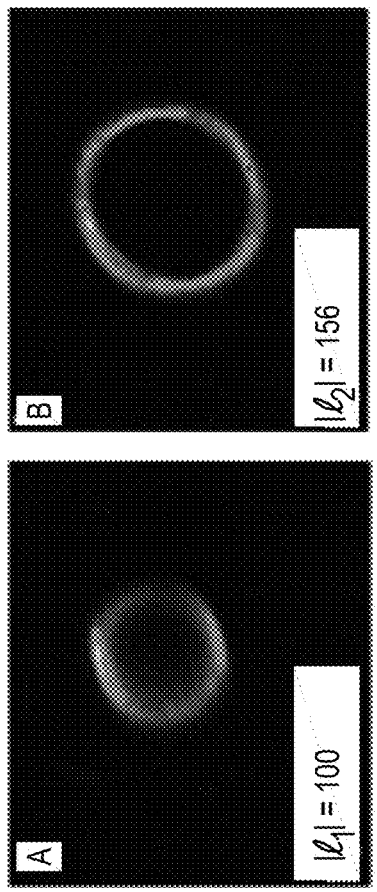
*FIG. 4A*
*FIG. 4B*
*FIG. 4C*
*FIG. 4D*
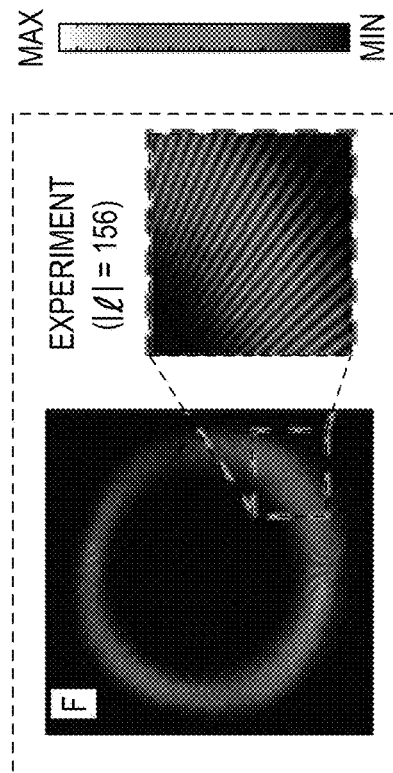
*FIG. 4E*
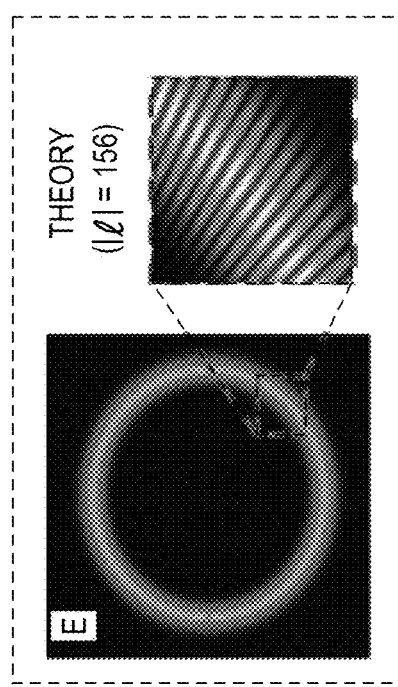
*FIG. 4F*

SYSTEM AND METHOD FOR TOPOLOGICAL LASERS GENERATING AND MULTIPLEXING OPTICAL BEAMS WITH UNBOUNDED ORBITAL ANGULAR MOMENTA

This application claims the benefit of U.S. Provisional Application Ser. No. 62/823,164, filed Mar. 25, 2019, the contents of which are incorporated herein by reference. This application is also related to International Application No. PCT/US18/43427, filed: Jul. 24, 2018 (22000/43).

BACKGROUND OF THE INVENTION

Field

The invention relates to optical integrated light sources carrying large orbital angular momentum.

Background

Vortices are topologically stable singularities at the center of a swirl of energy. That is, vortices are waves that possess a phase singularity and a rotational energy flow around a singular point or line. Vortices are ubiquitous in physics and have been observed in systems ranging from atmospheric scale tornadoes to atomic scale Bose-Einstein condensates. Optical vortices are beams carrying orbital angular momentum (OAM). They are conventionally formed using diffractive optics or by bespoke optical elements. Optical vortices possess a donut-shaped intensity profile and a helical phase structure with an azimuthal phase dependence of the form $\exp(i \ell \theta)$, where $\ell$, an unbounded integer called the topological charge, indicates the number of times and the direction in which the beam twists about its axis in one wavelength.

Optical beams carrying OAM promise revolutionary applications from metrology and particles manipulation, to enhanced resolution optical imaging. Helical wavefronts are usually formed using bulky devices such as spiral phase plates, cylindrical lens converters, Q-Plates, holograms, and spatial light modulators. These conventional techniques, including recently reported metasurfaces, require an external input beam originating from a separate light source.

Recently, an OAM laser with a topological charge of one, based on PT-symmetry, was reported. It emits a beam with an angular momentum of $\ell = M-N$, where M is the azimuthal resonant order of a ring and N is the total number of grating elements used to scatter light out. The formation of pure OAM states requires M and N to be close, thus limiting such techniques to small topological charges. Although the theoretically unbounded OAM basis makes it appealing in areas such as high-capacity communication, quantum cryptography, or increased resolution in particles motion detection, sources capable of generating arbitrarily large OAM have been challenging to develop. Furthermore, the ability to directly multiplex different lasers emitting OAM in an integrated device has remained elusive.

SUMMARY

Described herein is an optical integrated light source capable of generating a light beam carrying large Orbital Angular Momentum (OAM). The light source is made of a ring resonator called a topological ring, which is based on a physical concept called a topological insulator. In topological insulators, by forming a boundary between two distinct periodic structures with different topological invariants, it is possible to excite a one-way edge mode along their interface. In one implementation, an optical magnetic material such as yttrium iron garnet (YIG) is used to break the time-reversal symmetry. A gain material such as multiple quantum well structure (e.g., InGaAsP) is bonded onto the YIG substrate. Application of an external magnetic field (EMF) saturates the YIG, thus breaking the time-reversal symmetry. Furthermore, since OAM modes are orthogonal, OAM beams can be multiplexed with one another. These thus provide an integrated laser capable of generating large OAM beams and allows for multiplexing different OAM beams without crosstalk.

This Summary is provided to introduce a selection of concepts in a simplified form. The concepts are further described in the Detailed Description section. Elements or steps other than those described in this Summary are possible, and no element or step is necessarily required. This Summary is not intended to identify key features or essential features of the claimed subject matter, nor is it intended for use as an aid in determining the scope of the claimed subject matter. The claimed subject matter is not limited to implementations that solve any or all disadvantages noted in any part of this disclosure.

BRIEF DESCRIPTION OF THE DRAWINGS

FIGS. 2A-2D show scanning electron micrographs of topological-ring OAM lasers of the type described herein.

FIGS. 4A-4D respectively show far-field intensity patterns of the optical beams generated by the three topological rings shown in FIG. 1A and their multiplexing into a single laser source in the stimulated emission regime; FIGS. 4E-4F show the far-field interference patterns of the emission from the middle topological ring of charge $\ell_2$ with the opposite topological charge $-\ell_2$, obtained theoretically (FIG. 4E), and experimentally (FIG. 4F).

Like reference numerals refer to like elements throughout. Elements are not to scale unless otherwise noted.

DETAILED DESCRIPTION

Figure 1A:
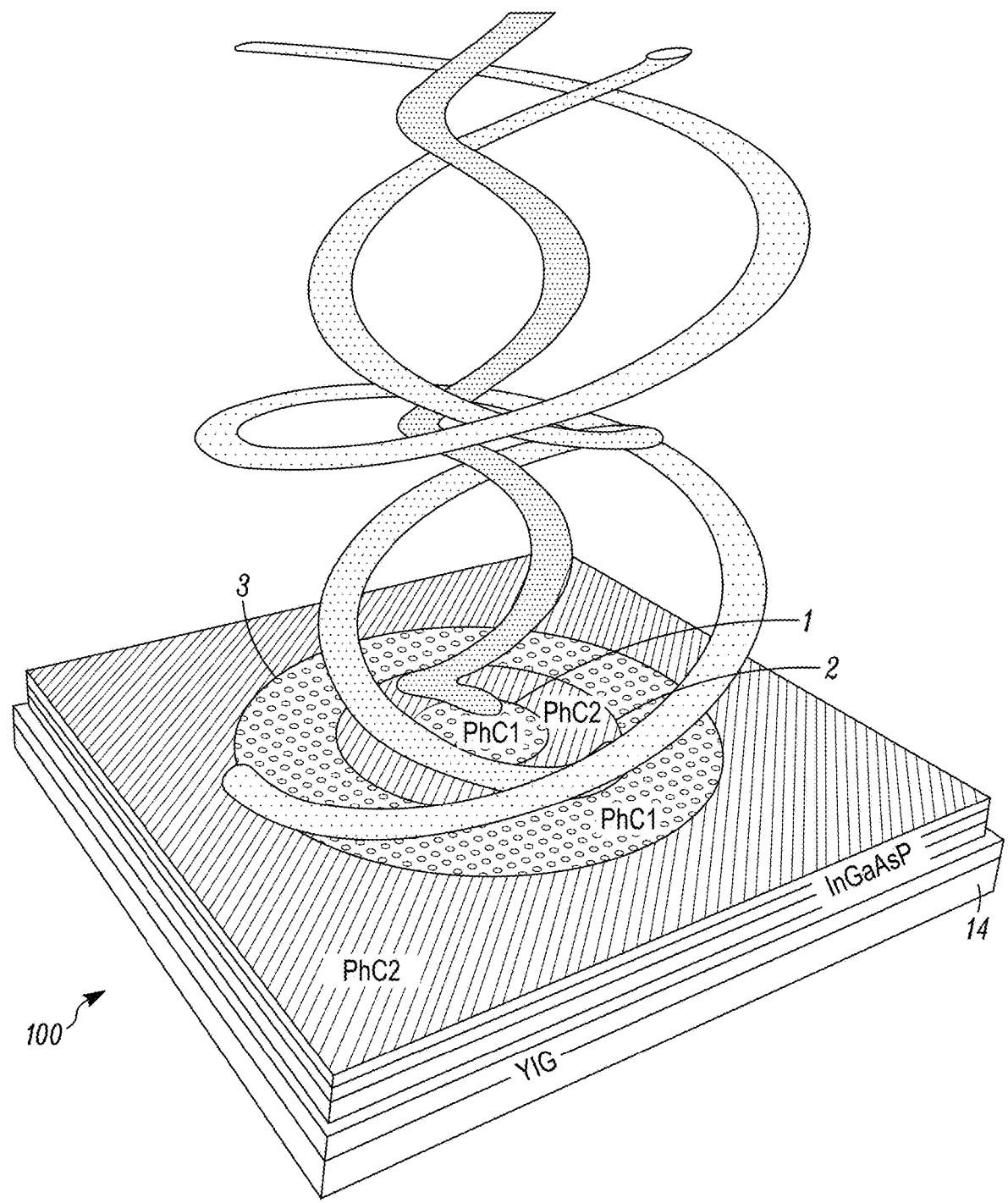
FIG. 1A shows a schematic diagram of one example of an unbounded orbital angular momentum (OAM) and multiplexing platform that can serve as a light source.

FIG. 1A shows a schematic diagram of one example of an unbounded orbital angular momentum and multiplexing platform that can serve as a light source 100. The light source 100 includes two or more concentrically arranged circular boundaries between two topologically distinct photonic crystals (PhCs) denoted PhC1 and PhC2. In this illustrative example three such boundaries are shown. Each boundary forms a two-dimensional cavity that is referred to herein as a topological ring. The three boundaries or topological rings are denoted in FIG. 1A as topological rings 1, 2 and 3. The dissimilar topologies of the photonic structures inside and outside a ring ensures the existence of one-way circulating edge states.

In conventional ring resonators, whispering gallery modes (WGMs) are excited in pairs (clockwise and counter-clockwise), resulting in zero net angular momentum. The topological rings described herein are made of 2.5D photonic structures that serve as leaky-wave emitters and thus radiate in the third dimension (i.e. out-of-plane). As such, they do not necessitate additional scattering elements to extract light from the cavities. The propagation phase offsets at different points of the traveling wave around the leaky-ring results in the formation of OAM beams in which the topological charge is equal to the azimuthal resonant order of the ring. The topological charge can thus be made arbitrarily large with the radii of rings. By alternating concentric circular or otherwise closed boundaries between two PhCs of distinct topologies, an arbitrary number of orthogonal OAM beams of alternating chiralities can be multiplexed in a planar manner using a single aperture.

The PhCs may be formed from any semiconductor light emitting material that may be pumped optically or electrically. In one particular embodiment, the PhCs may be formed from multiple quantum well (MQW) structures. For instance, the multiple quantum well structures may each include two or more InGaAsP quantum well layers separated by one or more quantum well barrier layers (e.g., GaAsP, InGaAsP). The mole fraction of the components in each layer may be tailored so that the structure emits light at the desired wavelength(s). For instance, the quantum well layer may have the form $In_xGa_{1-x}As_yP_{1-y}$ and, in one particular realization, may include nine $In_{x=0.564}Ga_{1-x}As_{y=0.933}P_{1-y}$ quantum well layers of 10 nm thickness (bandgap wavelength of 1600 nm) and $In_{x=0.737}Ga_{1-x}As_{y=0.569}P_{1-y}$ barrier layers of 20 nm thickness (bandgap wavelength of 1300 nm). Of course, the photonic structures 120 and 125 may be formed from other multiple quantum well structure including, for instance, InAlGaAs/InGaAs and AlGaSb/GaSb material systems. These material systems may result in topological cavity devices that operate at any suitable wavelengths(s), including wavelengths in the ultraviolet and visible spectral bands.

In one particular implementation, photonic crystal one (PhC1) is formed by a four-armed star-shaped unit-cell and has a non-trivial band gap with a non-zero Chern number, $|\Delta C|=1$. The Chern number is the topological invariant associated with the corresponding band gap of the photonic crystal. The band gap of PhC1 is called a non-trivial band gap because of its non-zero Chern number. Photonic crystal two (PhC2) has a triangular lattice with a cylindrical air hole unit-cell and a zero Chern number and hence a trivial band gap.

As further shown in FIG. 1A, the concentrically arranged topological rings 1, 2 and 3 shown in FIG. 1 are bonded on a layer of magnetic material 14 such as a garnet-based material. In one particular embodiment the magnetic material is yttrium iron garnet (YIG), which may be formed, for example, on a Gadolinium Gallium Garnet substrate. The YIG layer is used to break time-reversal symmetry in the system under a static external magnetic field (MF) that opens the non-trivial gap of PhC1.

The circular boundaries between PhC1 and PhC2 defining topological rings 1, 2 and 3 in FIG. 1A are leaky-wave topological-rings supporting one-way edge states. The number of edge modes inside the ring is equal to the difference between the Chern numbers of PhC1 and PhC2. Therefore, with a Chern number difference of one, only one unidirectional edge mode can propagate at the boundary of the two PhCs, making the cavity single mode, an important attribute for stable laser operation.

Figure 1B:
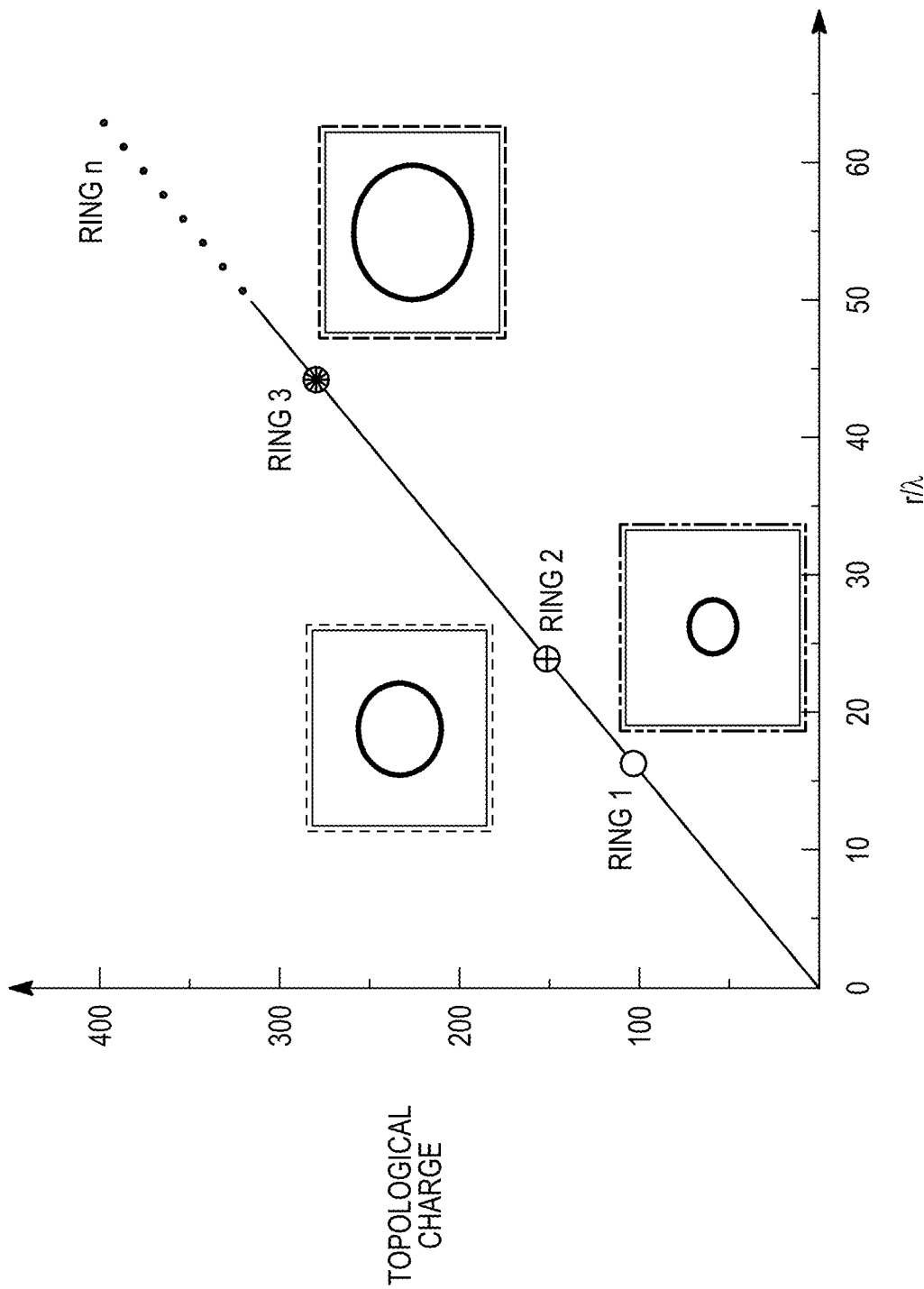
FIG. 1B presents the theoretical prediction of the topological charge $\ell$ of light as a function of the normalized radius of the topological-ring $r/\lambda$, where, r is the radius of the ring and $\lambda$ the wavelength of the edge mode.

FIG. 1B presents the theoretical prediction of the topological charge $\ell$ of light as a function of the normalized radius of the topological-ring r/λ, where, r is the radius of the ring and λ the wavelength of the edge mode. Theoretical far-field patterns of topological-rings of various charges $\ell_1$, $\ell_2$, $\ell_3$, and $\ell_n$ are shown as insets and correspond, as expected, to doughnut-shaped beams of increasing radii. The chirality of the edge states, i.e. the sign of the topological charge, can be controlled by simply reversing the static external MF.

FIGS. 2A-2D show scanning electron micrographs of topological-ring OAM lasers of the type described herein. The multiplexed topological rings, realized in one-step lithography, consist in the planar integration of topological ring 1, ring 2, and ring 3 in a single aperture. An arbitrary number of rings can thus be multiplexed using this principle. The non-trivial photonic crystal (PhC1) and the trivial photonic crystal (PhC2) can be seen in the figures The circular boundary encloses PhC1 in ring 1 (FIG. 2A), PhC2 in ring 2 (FIG. 2B), and PhC1 in ring 3 (FIG. 2C), resulting in edge states propagating clockwise in rings 1 and 3, and counter-clockwise in ring 2. The topological charges of the fabricated rings are $|\ell_1|=100$, $|\ell_2|=156$, and $|\ell_3|=276$ and they are naturally orthogonal states. FIG. 2D shows the multiplexed integrated topological rings corresponding to the planar superposition of topological rings 1, 2 and 3. The scale bars shown in FIGS. 2A-2D represent 10 μm and the units cells of PhC1 and PhC2 have a periodicity of p=1084 nm and p/3, respectively.

In one implementation, the photonic structures described above may fabricated by electron beam lithography followed by dry etching. The structures may then be bonded on a substrate supporting the magnetic material (e.g., a YIG substrate) using a thin layer of polymethyl methacrylate. The InP substrate, on which the InGaAsP MQW is epitaxially grown, is subsequently removed by wet etching using hydrochloric acid.

The laser source shown in FIG. 1A may be characterized by optically pumping the entire surface of the crystals in the presence of a static external MF of $B=+B_0e_z$ (normal to the PhCs plane) with $B_0=100$ Oe that saturates the YIG material. An edge mode with a frequency within the band gap of the two PhCs is excited and confined at the interface of PhC1 and PhC2. The absence of a band gap in the direction perpendicular to the structure plane for edge modes above light-line results in natural out-of-plane scattering of the one-way traveling wave around the cavity. The OAM beams originate from the interference of those leaky waves. This is a fundamental difference between the topological-rings described herein and conventional ring-resonators using whispering gallery mode (WGM) resonators, as the latter requires a large number of gratings to create out-of-plane scattering and maintain mode purity. In the laser source described herein, the generated topological charge is exactly the azimuthal number of the WGM, naturally enabling large charges. The micro-photoluminescence arrangement pumps the sample from the top with a pulsed laser ($\lambda_{pump}=1064$ nm, T=6 ns pulse at a repetition rate of 290 kHz) using an objective lens. The emission of the devices is collected using the same objective lens and directed to a monochromator for spectrum analysis or to an infrared camera for imaging.

Figure 3:
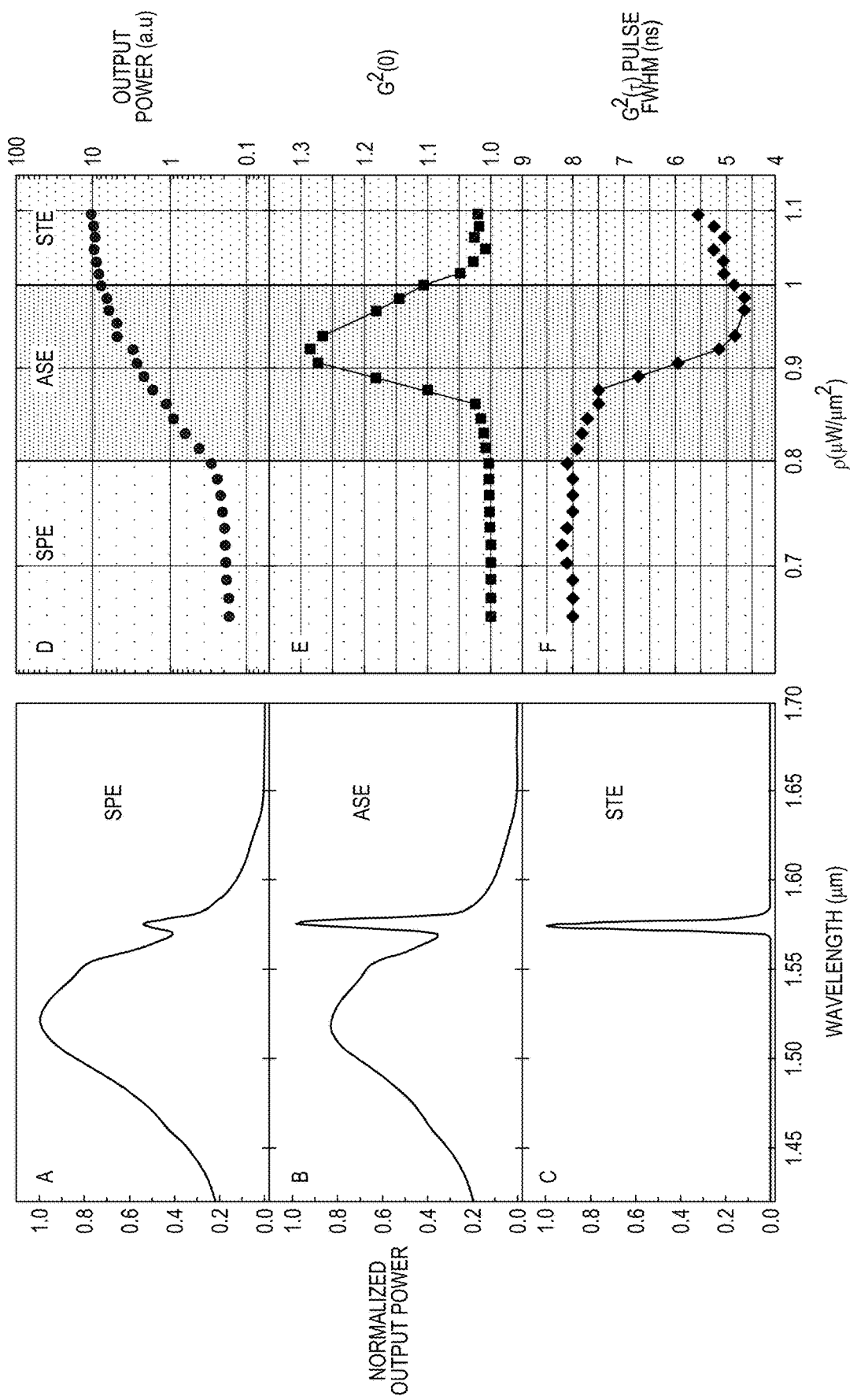
FIGS. 3A-3C shows the photoluminescence spectrum of optically pumped topological ring 2 in the presence of $B_0$ in three different regimes: the spontaneous emission (SpE) regime (FIG. 3A); the amplified spontaneous emission (ASE) regime (FIG. 3B); and the stimulated emission (StE) regime (FIG. 3C)
FIG. 3D presents the log-scale output power from a topological ring as a function of the pump power density (light-light curve)
FIG. 3E shows the zero-delay of the normalized second-order intensity correlation function.
FIG. 3F demonstrates that the full width at half maximum (FWHM) of the zero-delay $g^2(\tau)$ pulse shrinks in the SpE regime, reaches a minimum in the ASE regime, and broadens in the StE regime.

FIGS. 3A-3C shows the photoluminescence spectrum of optically pumped topological ring 2 in the presence of $B_0$ in three different regimes: the spontaneous emission (SpE) regime (FIG. 3A); the amplified spontaneous emission (ASE) regime (FIG. 3B); and the stimulated emission (StE) regime (FIG. 3C). The amplification and selection of a single mode at the wavelength of $\lambda=1575$ nm are observed with increasing pump power. Similar results were observed for other topological rings. FIG. 3D presents the log-scale output power as a function of the pump power density (light-light curve) and shows a characteristic lasing behavior.

To further investigate the coherent character and lasing characteristic of the cavity, the second-order intensity correlation function of its emission, $$g^2(\tau) = \frac{\langle I(t)I(t+\tau)\rangle}{\langle I(t)\rangle^2}$$

was measured using a Hanbury Brown-Twiss interferometer. $\langle I(t)\rangle$ represents the expectation value of the intensity at time t. FIG. 3E shows the zero-delay of the normalized second-order intensity correlation function, $g^2(0)$, and the three different regimes of spontaneous emission (SpE), amplified spontaneous emission (ASE), and stimulated emission (StE) are evidenced. Suppression of the photon bunching peak (visible in the ASE regime) is observed in the StE regime, i.e., lasing action. Furthermore, as demonstrated in FIG. 3F, the full width at half maximum (FWHM) of the zero-delay $g^2(\tau)$ pulse shrinks in the SpE regime, reaches a minimum in the ASE regime, and broadens in the StE regime. Such variations in the $g^2(\tau)$ pulse width are related to a nonlinear effect called the delay threshold phenomenon or dynamical hysteresis, which occurs in a laser only when the peak intensity of a pump pulse is larger than the threshold intensity. The distinct $g^2(\tau)$ width behaviors in the SpE and StE regimes signify that the suppression of the photon bunching peak (FIG. 3e) at high pump intensity indeed originates from lasing instead of SpE. It is worth noting that the unity $g^2(0)$ in the SpE regime is due to the limited time resolution of the detection system. Similar results are observed for other topological rings.

FIGS. 4A-4D respectively show far-field intensity patterns of the optical beams generated by topological rings 1, 2, 3 and their multiplexing into a single laser source, under a pump power density of $\rho=1.03$ μW/μm$^2$, i.e. in the stimulated emission regime. The figures clearly show the ring-shaped profiles of each topological ring. FIGS. 4E-4F show the far-field interference patterns of the emission from topological ring 2 of charge $\ell_2$ with the opposite topological charge $-\ell_2$, obtained theoretically (FIG. 4E), and experimentally (FIG. 4F). The opposite charge is achieved experimentally by reflecting the beam on a mirror. The interference patterns evidence fringes characteristic of beams carrying orbital angular momenta. The fringes are clearly observed in the insets of FIGS. 4E-4F. Topological ring 2 is designed for a charge of $|\ell_2|=156$ and the total number of measured fringes is 312. The interference patterns of other rings are measured in a similar manner. These results demonstrate the successful generation of coherent OAM beams of large charges.

In summary, topological ring-resonators have been demonstrated experimentally which emitting coherent beams carrying orbital angular momenta of arbitrarily large topological charges. The topological rings are formed by circular or otherwise closed boundaries between topologically distinct photonic structures and they constitute leaky-wave sources naturally radiating orthogonal orbital angular momenta states. Those states are multiplexed by integrating concentric topological rings emitting waves of controllable chirality. The coherent property of the laser sources has also been demonstrated by measuring their second-order intensity correlation. These results demonstrate that topological matter can be used to uniquely generate topological light and open the way to integrated lasers emitting on demand far-field patterns. Such laser sources will find applications in classical and quantum optics for use in technological fields such as communications, sensing, and imaging.

Although the subject matter has been described in language specific to structural features and/or methodological acts, it is to be understood that the subject matter defined in the appended claims is not necessarily limited to the specific features or acts described above.

The invention claimed is:

1. An optical integrated light source, comprising:
    a plurality of topological ring resonators, each of the topological ring resonators being defined by an interface between two distinct periodic structures having different topological invariants such that a one-way edge mode may be excited along the interface, wherein the topological ring resonators are each concentrically arranged with respect to one another; and
    a magnetic material arranged to interact with the plurality of topological ring resonators such that the optical integrated light source is structured and configured to generate plural beams each carrying orbital angular momentum.

2. The optical integrated light source of claim 1, wherein the magnetic material is configured to break the time-reversal symmetry in the topological ring resonators upon application thereto of an external magnetic field.

3. The optical integrated light source of claim 1, wherein the topological ring resonators are configured to emit light upon being optically pumped.

4. The optical integrated light source of claim 1, wherein the topological ring resonators are configured to emit light upon being electrically pumped.

5. The optical integrated light source of claim 1, wherein the two distinct periodic structures defining the topological ring resonators each include a multiple quantum well (MQW) structure.

6. The optical integrated light source of claim 5, wherein the multiple quantum well structure includes an InGaAsP quantum well material.

7. The optical integrated light source of claim 1, wherein the two distinct periodic structures defining the topological ring resonators include first and second photonic crystals having topological invariants.

8. The optical integrated light source of claim 7, wherein the first and second photonic crystals are formed from the same material and have different lattices.

9. The optical integrated light source of claim 1, wherein the magnetic material is a garnet-based magnetic material.

10. The optical integrated light source of claim 9, wherein the garnet-based magnetic material includes Yttrium Iron Garnet (YIG).

11. The optical integrated light source of claim 1, wherein the topological ring resonators in the plurality are defined by respective interfaces between two distinct periodic structures that are of the same type for all of the topological ring resonators.

12. The optical integrated light source of claim 1, wherein one of the photonic crystals has a non-zero Chern number and the other of the photonic crystals has a zero Chern number.

13. A method for generating multiplexed, orbital angular momentum (OAM) optical beams, comprising:
applying pump energy to an arrangement having plurality of topological ring resonators, each of the topological ring resonators being defined by an interface between two distinct periodic structures having different topological invariants such that a one-way edge mode may be excited along the interface wherein the topological ring resonators are each concentrically arranged with respect to one another; and
while applying the pump energy, applying a static magnetic field to a magnetic material so that time-reversal symmetry is broken in the plurality of topological ring resonators.

14. The method of claim 13, wherein the two distinct periodic structures defining the topological ring resonators each include a multiple quantum well (MQW) structure.

15. The method of claim 14, wherein the multiple quantum well structure includes an InGaAsP quantum well material.

16. The method of claim 13, wherein the two distinct periodic structures defining the topological ring resonators include first and second photonic crystals having topological invariants.

17. An optical integrated light source, comprising:
a series of alternating closed boundaries between two photonic crystals having different topological invariants such that a one-way edge mode may be excited along the interface, wherein the closed boundaries are concentric with one another; and
a magnetic material arranged to interact with the series of alternating closed boundaries such that the optical integrated light source is structured and configured to generate plural beams each carrying orbital angular momentum.

* * * * *